United States Patent [19]

Horie

[11] 4,080,616

[45] Mar. 21, 1978

[54] ELECTROSTATIC PUNCTURE PREVENTING ELEMENT

[75] Inventor: Noboru Horie, Kodaira, Japan

[73] Assignee: Hitachi, Ltd., Japan

[21] Appl. No.: 446,793

[22] Filed: Feb. 28, 1974

[30] Foreign Application Priority Data

Feb. 28, 1973  Japan .................................. 48-23175

[51] Int. Cl.² ........................................... H01L 29/90
[52] U.S. Cl. ...................................... 357/13; 357/36; 357/51; 357/86
[58] Field of Search ...................... 357/13, 48, 51, 86, 357/34, 36; 307/202

[56] References Cited

U.S. PATENT DOCUMENTS

| | | | |
|---|---|---|---|
| 3,210,620 | 10/1965 | Lin ........................................... | 357/13 |
| 3,590,340 | 6/1971 | Kubo et al. ............................ | 357/13 |
| 3,629,667 | 12/1971 | Lubart et al. .......................... | 357/86 |
| 3,712,995 | 1/1973 | Steudel .................................. | 357/13 |
| 3,739,238 | 6/1973 | Hara ....................................... | 357/13 |
| 3,754,171 | 8/1973 | Anzai et al. ........................... | 307/202 |
| 3,801,886 | 4/1974 | Imaizumi et al. ..................... | 357/86 |

*Primary Examiner*—Stanley D. Miller, Jr.
*Assistant Examiner*—Joseph E. Clawson, Jr.
*Attorney, Agent, or Firm*—Craig & Antonelli

[57] ABSTRACT

A protective element for preventing electrostatic puncture of a semiconductor integrated circuit comprises a semiconductor substrate of one conductivity type, a first semiconductor region of the opposite conductivity type formed within a selected part of the surface of the semiconductor substrate, and a second semiconductor region of the one conductivity type formed within a selected part of the surface of the first semiconductor region, the first and second semiconductor regions being partially short-circuited. When a surge pulse voltage is impressed between the substrate and the second region, the element operates as a diode or a transistor so as to absorb the surge pulse.

4 Claims, 8 Drawing Figures

ELECTROSTATIC PUNCTURE PREVENTING ELEMENT

BACKGROUND OF THE INVENTION

The present invention relates to an electrostatic puncture preventing element, and is mainly directed to a protective element for preventing electrostatic puncture in a semiconductor integrated circuit.

As a technique for preventing electrostatic puncture of a semiconductor integrated circuit (IC), there has hitherto been known a technique in which, as illustrated in FIG. 3, a resistor R is connected on the input side and in series with an integrated circuit 7, and the waveform of a surge pulse is smoothed by the time constant between a stray capacitance C and the resistance R, so as to prevent an abrupt surge pulse from entering the integrated circuit.

As another technique, there has been one in which, as illustrated in FIG. 4, a diode D adapted to break down by a surge pulse, is connected on the input side of and in parallel with an integrated circuit 7, to thereby absorb the surge pulse.

Regarding the former technique, it has been revealed that in constructing the resistor of a P-type region formed in an N-type semiconductor substrate, when a forward surge pulse is applied to the PN junction between the substrate and the P-type region, that is, a positive potential is applied to the resistor, the resistor does not puncture, whereas when a large surge pulse (—) is applied in the reverse direction, the resistor itself is punctured if the pulse is of a voltage exceeding the breakdown voltage of the PN junction.

Also, regarding the latter, frequently when reverse voltages exceeding the breakdown voltage of the junction of the diode are applied, the diode itself is punctured.

For these reasons, the prior-art protective elements have not been sufficiently protective. For example, they have been punctured by merely being applied with a surge pulse of a reverse voltage of one hundred and several tens of volts from an external terminal.

Thus, they have been punctured when applied with a reverse surge pulse of a voltage exceeding 100–130 V, and it has heretofore been unrealizable to make an IC having a breakdown voltage of over 100 V.

Consequently, ICs have easily been permanently punctured even by the slight electrostatic energy charged in the human body.

Particularly, when employing an IC in an electric circuit which generates a high voltage as in a television circuit, an automobile, etc., a surge pulse of 250V, 500V or higher is sometimes impressed on the circuit, and the puncture strength of the IC has come into question.

The present inventor has investigated a means to prevent the puncture preventing element and the circuit from been punctured even when a surge pulse of several hundred volts is applied from a signal input terminal.

It has been revealed from this investigation that where a forward surge pulse is applied to the PN junction of a semiconductor, the junction is not punctured even at a pulse voltage of several hundred volts, whereas where a reverse surge pulse is applied, it is punctured at a low voltage of 100–130 V.

The reason for this is not definite, at present, but the phenomenon is considered to be attributable to the fact that when a high reverse bias voltage is suddenly applied, currents are locally concentrated when a high voltage is applied on both sides of a depletion layer before the occurrence of breakdown.

The inventor of the present application has therefore devised connecting an element having transistor structure in parallel with the input terminal of the circuit to be protected in an IC substrate, so as to spuriously effect forward operation, whereby, when a surge pulse in either the forward or reverse direction is applied, the element portion is caused to operate as a transistor, in order to absorb the surge pulse.

The present invention has been developed as the result of the above investigation, and has as an object the provision of a puncture preventing element which is difficult to puncture for surge pulses in both the forward and reverse directions.

BRIEF DESCRIPTION OF THE INVENTION

The fundamental construction of the present invention for accomplishing this object lies in an electrostatic puncture preventing element, and is characterized in that a second conductivity type region is selectively formed in the surface of a first conductivity type semiconductor substrate. A first conductivity type region is selectively formed in the surface of the second conductivity type region, and the second conductivity type region and said first conductivity type region are partially short-circuited, so that the element can spuriously effect forward operation or operate as a transistor at least when a surge pulse voltage is applied between the first conductivity type semiconductor substrate and the first conductivity type region, so as to absorb such a surge pulse.

DETAILED DESCRIPTION OF THE INVENTION

Figure 1A:
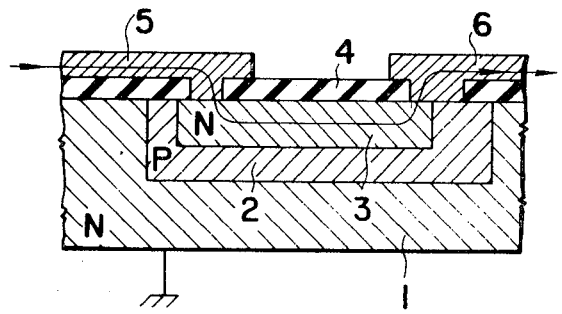
FIGS. 1a–1c are sectional views showing an embodiment of the present invention.
Figure 1B:
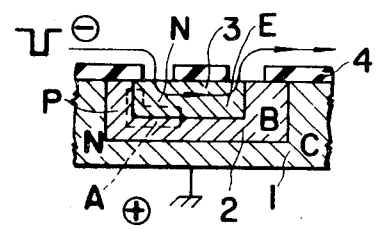
Figure 1C:
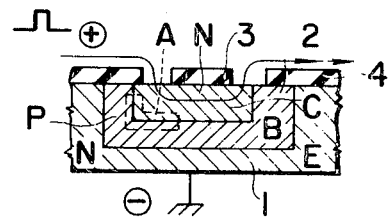

FIGS. 1a–1c show an embodiment of the present invention. In the figures numeral 1 designates an N-type semiconductor substrate, while numeral 2 indicates a P-type doped layer selectively formed in the surface of the substrate 1, which layer 2 is formed simultaneously with the base region of an N-P-N transistor (not shown). Numeral 3 represents an N-type doped layer selectively formed in the surface portion of the P-type doped layer 2, which layer 3 is formed simultaneously with the emitter region of the N-P-N transistor (not shown).

Numeral 4 denotes an $SiO_2$ film which protects the semiconductor surface, numeral 5 an interconnection film which connects the input terminal side and one end of the N-type doped layer 3, and numeral 6 an interconnection film which connects the input side of an internal circuit and the other end of the N-type doped layer 3 as well as the one end of the P-type doped layer 2.

In the usual case, an input signal is fed in the direction of the arrow, that is, from the interconnection film 5 through the interior of the N-type doped layer 4 via the interconnection film 6 to the input side of the circuit.

Herein, for a negative polarity surge pulse delivered from the input terminal, the circuit operation is as shown in FIG. 1b.

More specifically, when a surge current passes through the N-type doped layer 3 to reach the interconnection film 6, a voltage drop occurs due to the internal resistance of the doped layer 3. Even in the N-type doped layer 3, accordingly, the electric potential differs, whereas the potential of the P-type doped layer 2 is at a negative potential, which is equal to the highest potential in the N-type doped layer 3, since the P-type doped layer 2 and the N-type doped layer 3 are short-circuited. For this reason, directly under the interconnection film 5, at a part A depicted in FIG. 1b, a forward bias potential exists at the PN junction portion between the N-type doped layer 3 and the P-type doped layer 2. On the other hand, a reverse bias voltage is impressed between the N-type semiconductor substrate 1 and the P-type doped layer 2. Such a puncture element thereby becomes similar to a N-P-N transistor and effectively makes the P-type doped layer 2, the base, the N-type doped layer 3 the emitter and the N-type semiconductor substrate I the collector, and, in particular, current flows in such a manner that the injection of electrons occurs at and around the part A as shown in FIG. 1b, whereby a surge pulse can be absorbed, to prevent the surge from entering the input circuit. Since any surge voltage in the reverse direction is not directly exerted on one PN junction portion, the puncture preventing element is not adversely affected and can withstand a reverse surge pulse of approximately 1,000 V.

Where a forward surge pulse is applied from the input terminal, the situation becomes that as shown in FIG. 1c.

Also, in this case, when a surge current advances inside the N-type doped layer 3, the voltage drops, and eventually a reverse bias potential exists at the PN junction portion at the part A and in the vicinity thereof. On the other hand, the semiconductor substrate 1 is at a negative potential, so that a forward voltage is applied between the P-type doped layer 2 and the semiconductor substrate 1.

Consequently, the semiconductor substrate 1 effectively becomes, similarly, the emitter, the P-type doped layer 2 the base, and the N-type doped layer 3 the collector, and current flows in such manner that injection of electrons is from the substrate 1 to the P-type doped layer 2, whereby the surge pulse can be absorbed.

Thus, when a surge pulse in either the forward or reverse direction enters the circuit, such a surge pulse can be absorbed.

Figure 2A:
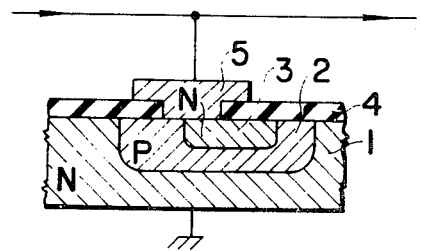
FIGS. 2a–2c are sectional views showing another embodiment of the present invention.
Figure 2B:
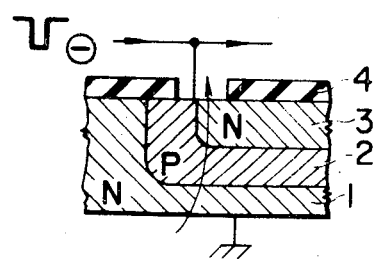
Figure 2C:
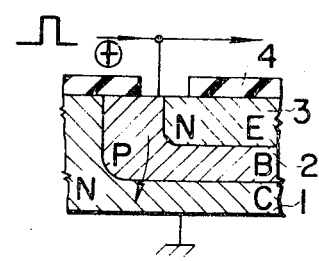
Figures 3, 4:
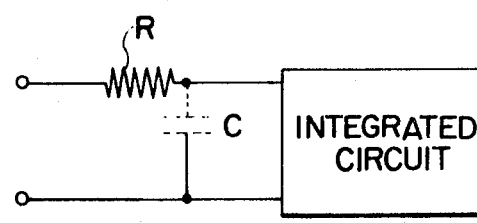
FIGS. 3 and 4 are input circuit diagrams.

FIGS. 2a–2c show another embodiment of the present invention.

This embodiment is constructed such that an electrode is led from that part of the PN junction portion between a P-type doped layer 2 and an N-type doped layer 3 which is exposed to the semiconductor surface, and the electrode and the substrate 1 are connected to the input side and in parallel with the circuit.

Where a reverse surge pulse is entered from the input terminal, the circuit takes the configuration shown in FIG. 2b.

More specifically, the element does not operate as a transistor initially in this case, but since leakage current flows, the N-type doped layer 3 is at the lowest (−) potential, the P-type doped layer subsequently attains a (−) higher potential, and the N-type substrate 1 reaches a (+) potential. Accordingly, a forward bias is impressed between the N-type doped layer 3 and the P-type doped layer 2, while a reverse bias is impressed between the P-type doped layer 2 and the N-type substrate 1.

As a result, the N-type doped layer 3 effectively becomes the emitter, the P-type doped layer 2 becomes the base, and the N-type semiconductor substrate 1 becomes the collector, and the injection of electrons occurs from the N-type doped layer 3, so that the element operates as a transistor. The surge pulse can, accordingly, be absorbed.

Where a forward surge pulse is applied from the input terminal, a forward bias occurs between the N-type semiconductor substrate 1 and the P-type doped layer 2 as illustrated in FIG. 2c, so that the element operates as a diode and can absorb the surge pulse.

With this embodiment, as in the foregoing embodiment, when a surge pulse in either the forward or reverse direction is applied, it can be absorbed, and puncture of the IC can be prevented.

While I have shown and described several embodiments in accordance with the present invention, it is understood that the same is not limited thereto but is susceptible of numerous changes and modifications as known to a person skilled in the art, and I, therefore, do not wish to be limited to the details shown and described herein but intend to cover all such changes and modifications as are obvious to one of ordinary skill in the art.

I claim:

1. An electrostatic puncture preventing element for preventing electrostatic puncture of an input circuit element of a semiconductor integrated circuit comprising, in combination:

a semiconductor substrate having a first conductivity type;

a first semiconductor region, having a second conductivity type opposite said first conductivity type, formed in a first surface portion of said substrate and forming a first PN junction therewith;

a second semiconductor region, having said first conductivity type, formed in said first semiconductor region and forming a second PN junction therewith;

a first conductive means for directly and electrically connecting a surface portion of said first semiconductor region to a surface portion of said second semiconductor region adjacent to the surface portion of said first semiconductor region;

means for externally connecting said first conductive means to said input circuit element of said semiconductor integrated circuit;

means for supplying an input signal, to be applied to said input circuit element, to said first conductive means; and means for supplying a reference potential to said substrate.

2. An electrostatic puncture preventing element according to claim 1, wherein said first conductivity type is N-type and said second conductivity type is P-type.

3. An electrostatic puncture preventing element for preventing electrostatic puncture of an input circuit element of a semiconductor integrated circuit comprising, in combination:

a semiconductor substrate having of first conductivity type;

a first semiconductor region, having a second conductivity type opposite said first conductivity type, formed in a first surface portion of said substrate and defining a first PN junction therewith;

a second semiconductor region, havng said first conductivity type, formed in said first semiconductor region and defining a second PN junction therewith;

first conductive means for directly and electrically connecting a first surface portion of said first semiconductor region to a first surface portion of said second semiconductor region adjacent thereto so as to overlap a first surface portion of said second PN junction;

second conductive means, disposed in direct electrical contact with a second surface portion of only said second semiconductor region which is spaced apart from the first surface portion thereof, for applying an input signal, to be coupled to said input circuit element, to said second semiconductor region at the second surface portion thereof;

means for externally connecting said first conductive means to said input circuit element of said semiconductor integrated circuit; and means for supplying a reference potential to said substrate.

4. An electrostatic puncture preventing element according to claim 3, wherein said first conductivity type is N-type and said second conductivity type is P-type.

* * * * *